(12) United States Patent
Popescu

(10) Patent No.: US 9,476,954 B2
(45) Date of Patent: Oct. 25, 2016

(54) METHOD AND APPARATUS TO GENERATE MAGNETIC RESONANCE DATA

(71) Applicant: Stefan Popescu, Erlangen (DE)

(72) Inventor: Stefan Popescu, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 474 days.

(21) Appl. No.: 14/096,301

(22) Filed: Dec. 4, 2013

(65) Prior Publication Data

US 2014/0152306 A1 Jun. 5, 2014

(30) Foreign Application Priority Data

Dec. 4, 2012 (DE) .......................... 10 2012 222 149

(51) Int. Cl.
| *G01V 3/00* | (2006.01) |
| *G01R 33/48* | (2006.01) |
| *G01R 33/565* | (2006.01) |
| *G01R 33/561* | (2006.01) |

(52) U.S. Cl.
CPC ..... *G01R 33/4824* (2013.01); *G01R 33/56545* (2013.01); *G01R 33/561* (2013.01)

(58) Field of Classification Search
USPC ........................................................ 324/309
See application file for complete search history.

(56) References Cited

U.S. PATENT DOCUMENTS

| 7,583,780 B2 | 9/2009 | Hsieh et al. | |
| 2008/0197842 A1* | 8/2008 | Lustig | G01R 33/561 |
| | | | 324/307 |
| 2011/0095762 A1 | 4/2011 | Piccini et al. | |
| 2011/0148410 A1 | 6/2011 | Zaitsev et al. | |
| 2012/0256628 A1* | 10/2012 | Wong | G01R 33/4836 |
| | | | 324/309 |
| 2014/0185894 A1* | 7/2014 | Menzel | G01R 33/56341 |
| | | | 382/131 |

OTHER PUBLICATIONS

Lustig et al., "Sparse MRI: The Application of Compressed Sensing for Rapid MR Imaging," Magnetic Resonance in Medicine, vol. 58, (2007), pp. 1182-1195.
Tam et al., "Null Space Imaging: Nonlinear Magnetic Encoding Fields Designed Complementary to Receiver Coil Sensitivities for Improved Acceleration in Parallel Imaging," Magnetic Resonance in Medicine, vol. 68, (2012), pp. 1166-1175.
Katoh et al., "MRI of Coronary Vessel Walls Using Radial k-Space Sampling and Steady-State Free Precession Imaging," AJR, 186, (2006), pp. S401-S406.
Lin et al., "Parallel imaging technique using localized gradients (PatLoc) reconstruction using compressed sensing (CS)," Proc. Intl. Soc. Mag. Reson. Med., vol. 18, (2010), p. 546.

(Continued)

*Primary Examiner* — Rodney Fuller
(74) *Attorney, Agent, or Firm* — Schiff Hardin LLP

(57) ABSTRACT

In a method, a magnetic resonance system, and a computer-readable storage medium to generate magnetic resonance measurement data of an imaging area of an examination subject, the imaging area being located in a measurement volume of the magnetic resonance system, by operation of the magnetic resonance system, during the acquisition of the magnetic resonance measurement data, at least one additional nonlinear gradient is switched in addition to the gradients for spatial coding, and k-space is read out according to a random pattern, less densely than is required by the Nyquist condition.

9 Claims, 5 Drawing Sheets

(56) References Cited

OTHER PUBLICATIONS

Lustig et al., "Compressed Sensing MRI," pp. 1-38, dated prior to Dec. 4, 2013.

Tam et al., "Null Space Imaging with Compressed Sensing for Rapid Parallel Imaging," Proc. Intl. Soc. Mag. Reson. Med. 19 (2011), p. 2893.

* cited by examiner

METHOD AND APPARATUS TO GENERATE MAGNETIC RESONANCE DATA

BACKGROUND OF THE INVENTION

The present invention concerns: a method to generate magnetic resonance data of an imaging area of an examination subject that is located in a measurement volume of a magnetic resonance system, and a corresponding electronically readable data medium encoded with programming instructions, and a magnetic resonance system for implementing such a method.

DESCRIPTION OF THE PRIOR ART

Images of the inside of an examination subject can be generated with a magnetic resonance (MR) modality. For this purpose, the examination subject is positioned in a strong, static, homogenous basic magnetic field (also called a $B_0$ field) in a magnetic resonance system so that its nuclear spins orient along the basic magnetic field. For spatial coding of the measurement data, magnetic gradient fields (shortened to "gradients") are superimposed on the basic magnetic field.

To determine material properties of the examination subject to be imaged, the dephasing or relaxation time after a deflection of the magnetization out of the initial alignment is detected so that different relaxation mechanisms or relaxation times that are typical to the material can be identified. The deflection typically takes place by radiation of radio-frequency excitation pulses (RF excitation pulses) into the examination subject (referred to as an excitation of echo signals), and the spatial resolution is based on a temporally established manipulation of the deflected magnetization by the gradient field in a measurement sequence that establishes a precise temporal workflow of RF pulses, change of the gradient field (by emission of a switching sequence of gradient pulses) and the detection of measurement values.

With MR techniques, it is possible to show soft tissues with high contrast. Different substances can be shown and differentiated well with suitable sequences based on their different physical properties, such as the relaxation time of the longitudinal magnetization $T1$, the decay time of the transverse magnetization $T2$ or the time constant of the free induction decay $T2^*$ (also called effective decay time of the transverse magnetization).

In the excitation, a differentiation is made between selective RF excitation pulses (that excite only one slice in the examination subject, for example) and non-selective RF excitation pulses. Non-selective RF excitation pulses optimally uniformly excite the entire examination subject or at least the examination region that is to be examined in the examination subject. Additional gradients are switched (activated) for spatial resolution. For example, gradients are switched in the slice direction for a resolution in the slice direction.

An association between the measured magnetization—from which the noted material properties can be derived—and a spatial coordinate of the measured magnetization typically takes place with the implementation of an intermediate step. In this intermediate step, acquired raw magnetic resonance data are entered into an electronic memory at respective memory points organized as "k-space". The coordinates of k-space are coded as a function of the gradient field. The gradient field varies the resonance frequency (Larmor frequency) and, for example, the phase position of the magnetization deflected by an RF pulse as well, in a spatially dependent manner, such that spatial information is obtained by identification of the phase position and resonance frequency of the measured magnetization. In other words, spatial information is based—with phase and frequency coding—on the coordinate system of k-space (spatial frequency) and is determined as a function of the gradient field. The magnitude of the magnetization (in particular of the transverse magnetization, defined in a plane transverse to the basic magnetic field) at a defined location of the examination subject can be determined from the readout point with the use of a Fourier transformation. Such a Fourier transformation calculates a signal strength of the signal in the spatial domain from a signal strength (magnitude of the magnetization) that is associated with a defined frequency (the spatial frequency).

k-space thus forms an inverse Fourier domain relative to the spatial domain of the examination subject, such that the magnetic resonance signals in the spatial domain are transformed by a Fourier transformation into the image domain for creation of the magnetic resonance image. The gradient field thus defines a point in k-space, and the curve of the change (gradient) of the gradient field establishes a series of k-space points that can be designated as a "trajectory" through k-space, or also as a "projection".

If k-space is not sufficiently read out (i.e. data points therein that are available to be filled with a data entry are not filled) in order to detect all variations of the signal, artifacts can thus arise in the reconstructed image. In order to prevent this, the Nyquist condition—which states that a signal with a sample interval $\Delta t$ cannot include a frequency that is greater than $1/(2\Delta t)$—must be satisfied.

A method to obtain magnetic resonance measurement data in k-space using nonlinear gradients is known from U.S. Pat. No. 7,583,780.

SUMMARY OF THE INVENTION

An object of the invention is to optimize the time for the readout of k-space, thus the time to create the magnetic resonance measurement data.

In the following, the achievement of the object is described with regard to the method according to the invention. Features, advantages or alternative embodiments that are mentioned are also applicable to the apparatus and data storage medium according to the invention, and vice versa. The corresponding functional features of the method are formed by corresponding substantive modules in the apparatus, in particular by hardware modules.

The invention exploits the use of decay patterns while switching nonlinear gradients and while violating the Nyquist condition to read out k-space in order to shorten the time to create the magnetic resonance measurement data, and while still preventing artifacts in the reconstructed image.

In accordance with the invention, a method is provided that generates magnetic resonance measurement data of an imaging area (located in a measurement volume of a magnetic resonance system) of an examination subject by operation of the magnetic resonance system, and includes the following steps:
  excite echo signals by radiating successive RF excitation pulses with a radio-frequency antenna of the magnetic resonance system,
  acquire echo signals with the radio-frequency antenna after every radiated RF excitation pulse while switching different gradients for spatial coding via readout of defined k-space along trajectories that are predetermined by the switched gradients, wherein k-space is read out according to a random pattern with less density than required by the Nyquist condition, and wherein at least one additional nonlinear gradient is switched relative to the gradients for spatial coding, store the acquired echo signals as magnetic resonance measurement data.

The degrees of freedom that are obtained via the activation of nonlinear gradients according to the invention contribute to reading out k-space with an optimizable random pattern with simultaneous minimization of unwanted correlations between read-out k-space points.

Since the readout of k-space takes place with less density than is required by the Nyquist condition, the acquisition of magnetic resonance measurement data is accelerated. In the reconstruction of images from the magnetic resonance measurement data that are connected with underdetermined equation systems, the image artifacts typically generated by such an undersampling are likewise minimized by avoiding correlations between the read-out k-space points. Through the random readout pattern, such an underdetermined equation system can be solved according to the theory of compressed sensing, and the images can be reconstructed without artifacts.

In a preferred embodiment, defined k-space is read out along radial trajectories.

In another embodiment, the amplitude of at least one gradient for spatial coding is varied according to a random pattern between the radiation of the RF excitation pulses.

In a further embodiment, the region in which the readout process is situated along each trajectory is modified according to a random pattern. This corresponds to a variable step width along the trajectory.

In a further embodiment, the amplitude of at least one nonlinear gradient switched during the readout of a trajectory is changed according to a random pattern from one read-out trajectory to the next trajectory read out after an additional RF excitation pulse.

Another embodiment according to the invention includes the change of the amplitude of at least one nonlinear gradient according to a random pattern during the readout process along the read-out trajectory.

A further embodiment according to the invention includes the change of a nonlinear term of at least one nonlinear gradient according to a random pattern during the readout process along the read-out trajectory. This also corresponds to a random selection of a nonlinear gradient from a set of suitable nonlinear gradients.

The described changes of different parameters according to a random pattern minimize possible correlations between read-out k-space points, and the readout of k-space less densely than is required by the Nyquist condition accelerates the acquisition of the magnetic resonance measurement data.

Within the scope of the present invention, a magnetic resonance system is also provided for the generation of magnetic resonance measurement data of an imaging area of an examination subject that is located in a measurement volume of said magnetic resonance system. The magnetic resonance system has a data acquisition unit (scanner) with a magnet unit and a gradient field system to generate a magnetic field and a gradient field in the measurement volume, a control unit to control the scanner, a transmission/reception device to transmit RF excitation pulses and receive echo signals produced by the scanner, and an evaluation device to evaluate the signals.

The scanner and the transmission/reception device are operated to scan k-space corresponding to the imaging area and to implement the following steps:

excite echo signals by means of successive RF excitation pulses radiated by a radio-frequency antenna of the magnetic resonance system acquire echo signals by means of the radio-frequency antenna, after every radiated RF excitation pulse while switching different gradients for spatial coding, by reading out defined k-space along trajectories that are predetermined by the switched gradients, wherein k-space is read out according to a random pattern less densely than is required by the Nyquist condition, and wherein at least one additional nonlinear gradient is switched relative to the gradients for spatial coding, store the acquired echo signals as magnetic resonance measurement data.

The present invention also encompasses a non-transitory, computer-readable data storage medium encoded with programming instructions that, when the data storage medium is loaded into a computerized control and evaluation system of a magnetic resonance apparatus, cause the magnetic resonance apparatus to be operated in accordance with one or more embodiments of the above-described method in accordance with the invention. The software can thereby be a source code that must still be compiled and linked or that must only be interpreted, or an executable software code that only is still to be loaded into the corresponding computer for execution.

The computer-readable storage medium can be, for example, a DVD, a magnetic tape or a USB stick on which is stored electronically readable control information, in particular software.

As noted above, the advantages of the magnetic resonance system according to the invention and of the computer-readable storage medium according to the invention essentially correspond to the advantages of the method according to the invention.

DESCRIPTION OF THE PREFERRED EMBODIMENTS

Figure 1:
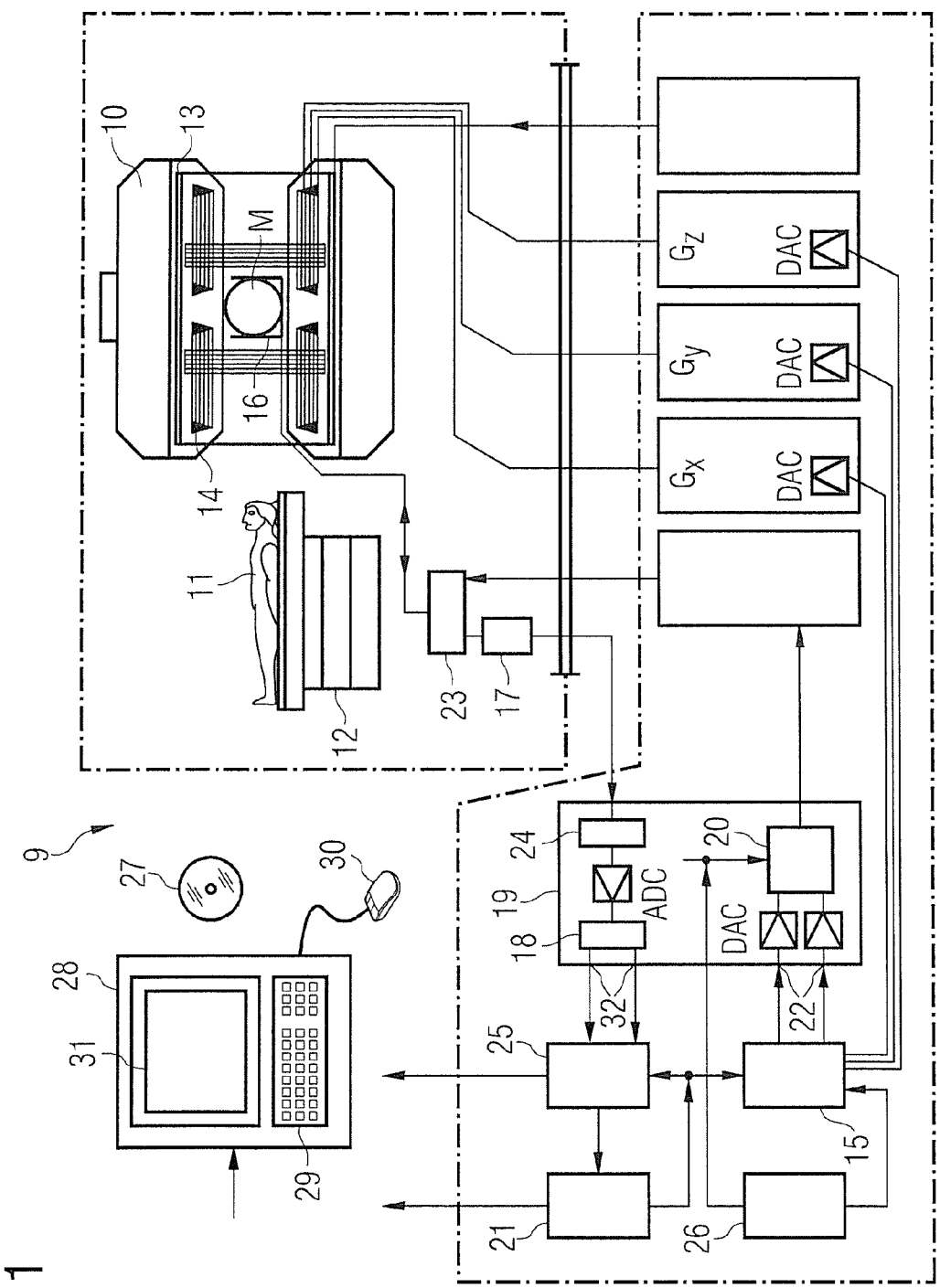
FIG. 1 schematically illustrates a magnetic resonance system according to the invention.

FIG. 1 is a schematic presentation of a magnetic resonance system 9 (a magnetic resonance imaging or magnetic resonance tomography system). A basic field magnet 10 generates a temporally constant strong magnetic field for polarization or alignment of the nuclear spins in an examination region of a subject 11 (for example of a part of a human body that is to be examined) which, lying on a table 12, is moved into the magnetic resonance system 9 for examination. The high homogeneity of the basic magnetic field that is required for the magnetic resonance measurement is defined in a typically spherical measurement volume M into which the part of the human body that are to be examined is moved. To support the homogeneity requirements, and in particular to eliminate temporally invariable influences, shim plates made of ferromagnetic material are mounted at a suitable location. Temporally variable influences are eliminated by shim coils 13, if they are not desired. These coils are also used in the generation of nonlinear gradients.

In the basic field magnet 10, a cylindrical gradient field system 14 is used that is composed of three sub-windings. Each sub-winding is supplied by an amplifier with current to generate a linear (also temporally variable) gradient field in the respective direction of the Cartesian coordinate system. The first sub-winding of the gradient field system 14 generates a gradient $G_x$ in the x-direction, the second sub-winding generates a gradient $G_y$ in the y-direction, and the third sub-winding generates a gradient $G_z$ in the z-direction. The nonlinear gradients are also generated by the gradient field system 14. The amplifier includes a digital/analog converter DAC which is controlled by a sequence controller 15 for time-accurate generation of gradient pulses.

Located within the gradient field system 14 is at least one radio-frequency antennas 16 that converts the radio-frequency pulses emitted by a radio-frequency power amplifier into an alternating magnetic field for excitation of the nuclei and deflection of the nuclear spins of the subject 11 to be examined, or of the region of the subject 11 that is to be examined. Each radio-frequency antenna 16 has one or more RF transmission coils and one or more RF reception coils or RF reception antennas in the form of an annular (advantageously linear or matrix-like) arrangement of component coils. The alternating field emanating from the precessing nuclear spins—i.e. normally the nuclear spin echo signals caused by a pulse sequence composed of one or more radio-frequency pulses and one or more gradient pulses—is also converted by the RF reception coils of the radio-frequency antenna 16 into a voltage (measurement signal), which is supplied via an amplifier 17 to a radio-frequency reception channel 18 of a radio-frequency system 19. The radio-frequency system 19 furthermore has a transmission channel 20 in which the radio-frequency pulses are generated for the excitation of magnetic resonance. The respective radio-frequency pulses are digitally represented in the sequence controller 15 as a series of complex numbers based on a pulse sequence predetermined by the system computer 21. This number sequence is supplied as a real part and imaginary part to a digital/analog converter DAC in the radio-frequency system 19 via respective inputs 22, and from said digital/analog converter DAC to a transmission channel 20. In the transmission channel 20, the pulse sequences are modulated on a radio-frequency carrier signal whose base frequency corresponds to the resonance frequency of the nuclear spins in the measurement volume.

The switching from transmission operation to reception operation takes place via a transmission/reception diplexer 23. The RF transmission coils of the radio-frequency antenna 16 radiate the radio-frequency pulses for excitation of the nuclear spins into the measurement volume M and scans resulting echo signals via the RF reception coils. The correspondingly acquired magnetic resonance signals are phase-sensitively demodulated to an intermediate frequency in a reception channel 24 (the first demodulator of the radio-frequency system 19) and digitized in an analog/digital converter ADC. This signal is further demodulated to a frequency of zero. Demodulation to a frequency of zero, and the separation into the real part and the imaginary part, occur in a second demodulator 18 that is connected with an output 32 after the digitization in the digital domain.

An MR image is reconstructed by an image computer 25 from the measurement data acquired in such a manner. The administration of the measurement data, the image data and the control programs takes place via the system computer 21. Based on a specification with control programs, the sequence controller 15 monitors the generation of the respective desired pulse sequences and the corresponding scanning of k-space. The sequence controller 15 thereby controls the accurately-timed switching of the gradients, the emission of the radio-frequency pulses with defined phase amplitude and the reception of the nuclear magnetic resonance signals. The time base for the radio-frequency system 19 and the sequence controller 15 is provided by a synthesizer 26. The selection of corresponding control programs to generate an MR image (which control programs are stored on a DVD 27, for example) and the presentation of the generated MR image take place via a terminal 28 which comprises a keyboard 29, a mouse 30 and a monitor 31.

Figure 2:
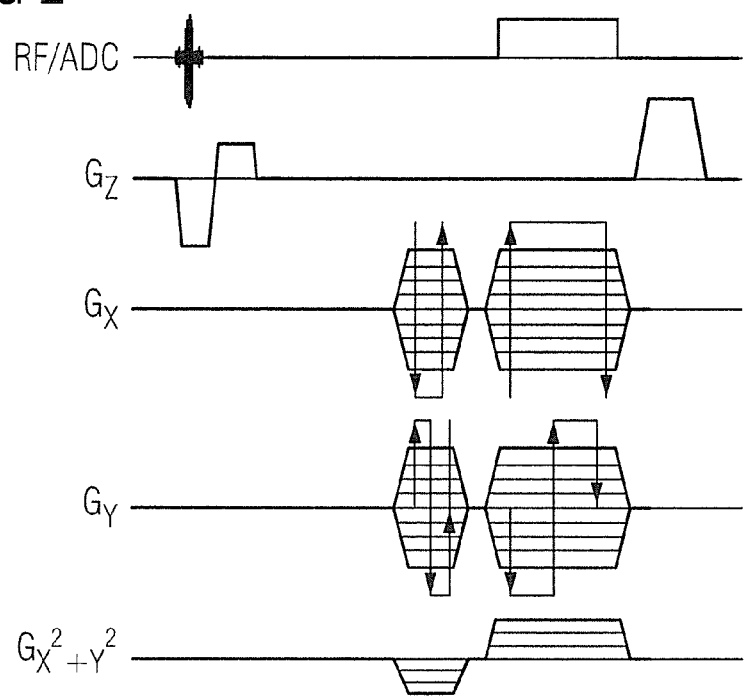
FIG. 2 shows a measurement sequence of a method according to the invention.

FIG. 2 shows a measurement sequence of a method according to the invention. The amplitudes of the gradients $G_x$ and $G_y$ are not modified with a constant step width between the radiation of the RF excitation pulses, but rather via a random change of the number of steps.

All algorithms that can output a random number such that the random number corresponds to a number of steps are usable as random algorithms.

A random change of the number of steps, and therefore the step widths of the amplitudes of the gradients $G_x$ and $G_y$ between the radiation of the RF excitation pulses, results in a random change of the angle between radial trajectories between the radiation of the RF excitation pulses when k-space is read out along radial trajectories.

The measurement sequence likewise provides the random change of the amplitude of the additionally switched nonlinear gradients $G_{x^2+y^2}$ from one read-out trajectory to the next trajectory read out after an additional RF excitation pulse. For example, a random change of the amplitude or a change of the amplitude according to a random pattern here means the multiplication of a constant amplitude change with a random scalar.

Alternatively, the measurement sequence also provides a random change of the amplitude of the nonlinear gradient $G_{x^2+y^2}$ during the readout process along the read-out trajectory. For example, a random change of the amplitude or a change of the amplitude according to a random pattern here means the multiplication of a constant amplitude change with the value of a time-dependent random function.

Figure 3:
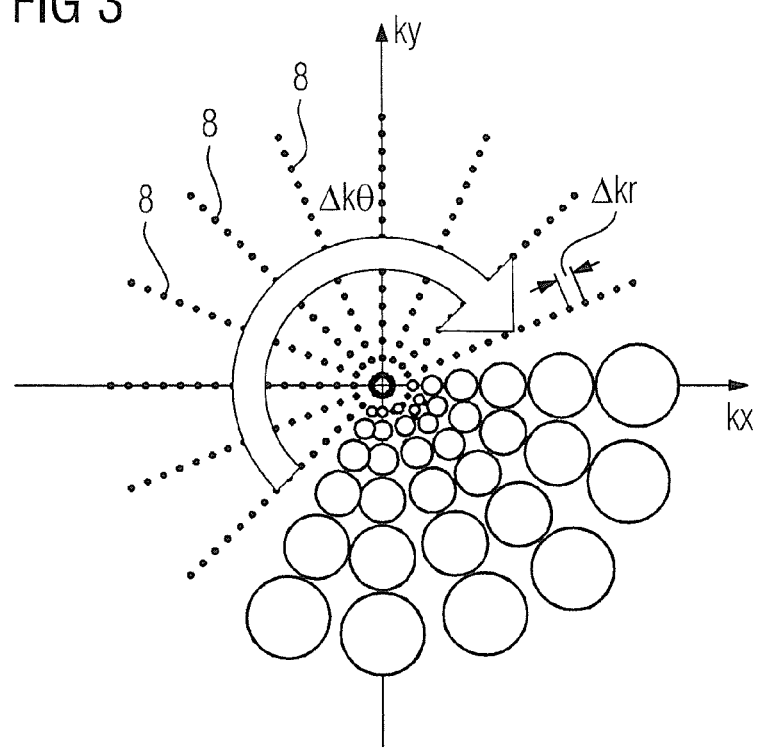
FIG. 3 shows a radial readout method according to a random pattern.

FIG. 3 shows a radial readout method according to the method of k-space according to a random pattern (here in two dimensions $k_x$ and $k_y$). The angle $\Delta k\Theta$ between radial trajectories 8 is changed according to a random pattern between the radiation of different RF excitation pulses, and the amplitude of the switched nonlinear gradients is changed according to a random pattern from one readout trajectory to the next during the readout process. $\Delta kr$ designates the step width between two k-space points along the radial trajectories 8, the change of which according to a random pattern is likewise the subject matter of the solution according to the invention.

Figure 4:
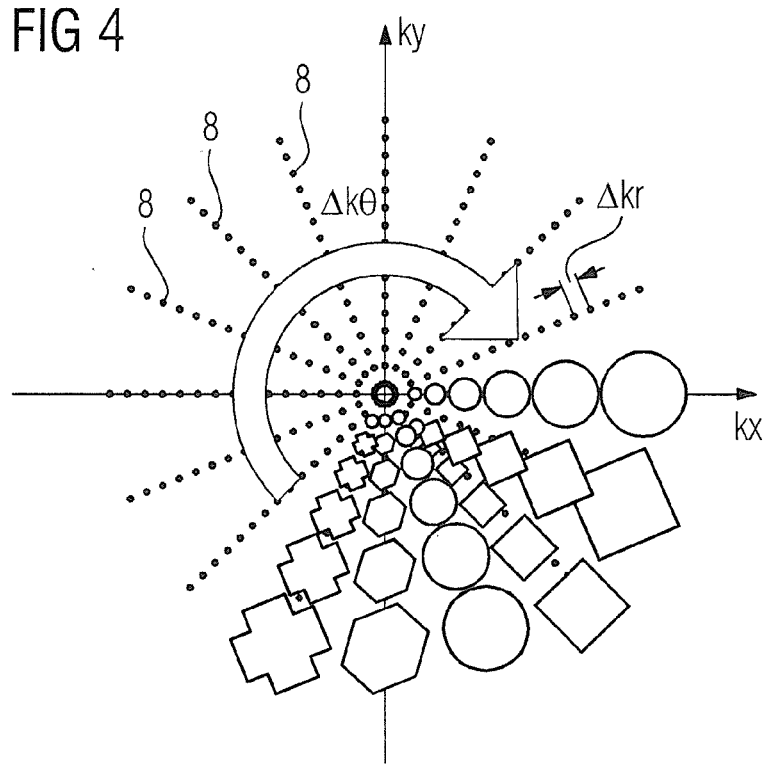
FIG. 4 shows an additional radial readout method according to a random pattern.

FIG. 4 shows an additional radial readout method according to the invention of k-space according to a random pattern (here in two dimensions $k_x$ and $k_y$). The amplitude of the nonlinear gradients is changed according to a random pattern during the readout process along the read-out trajectory, and a nonlinear term of a nonlinear gradient is changed according to a random pattern during the readout process along the read-out trajectory. For example, here a random change of the term of a nonlinear gradient, or a change of the term of a nonlinear gradient according to a random pattern, means the random selection of a nonlinear gradient from a set of suitable nonlinear gradients. $\Delta kr$ designates the step width between two k-space points along the radial trajectories 8.

Figure 5:
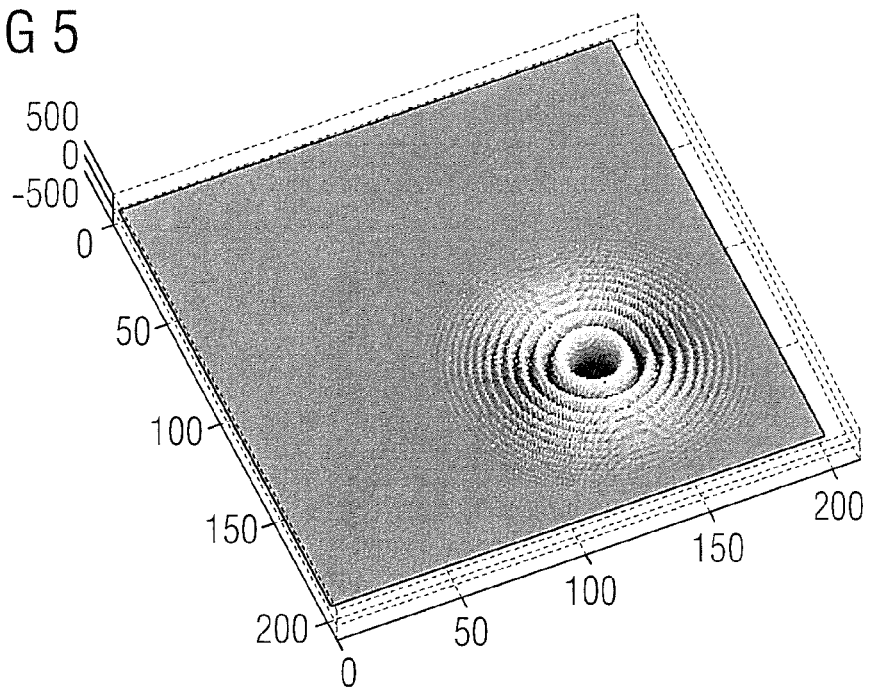
FIG. 5 shows an example of a point spread function for a nonlinear gradient.

FIG. 5 shows an example of a point spread function for the nonlinear gradients $x^2+y^2$. A point spread function describes the response of an imaging system to the input of an ideal, point-like object; it is the Fourier transform of a filter.

In this context, in addition to radial methods the solution according to the invention provides additional methods for MR data acquisition which scan the center of k-space multiple times—such as segmented, spiral-shaped methods, or "PROPELLER" (Periodically Rotated Overlapping ParallEL Lines with Enhanced Reconstruction) methods—in two or three dimensions while switching of nonlinear gradients and while violating the Nyquist theorem.

Figure 6:
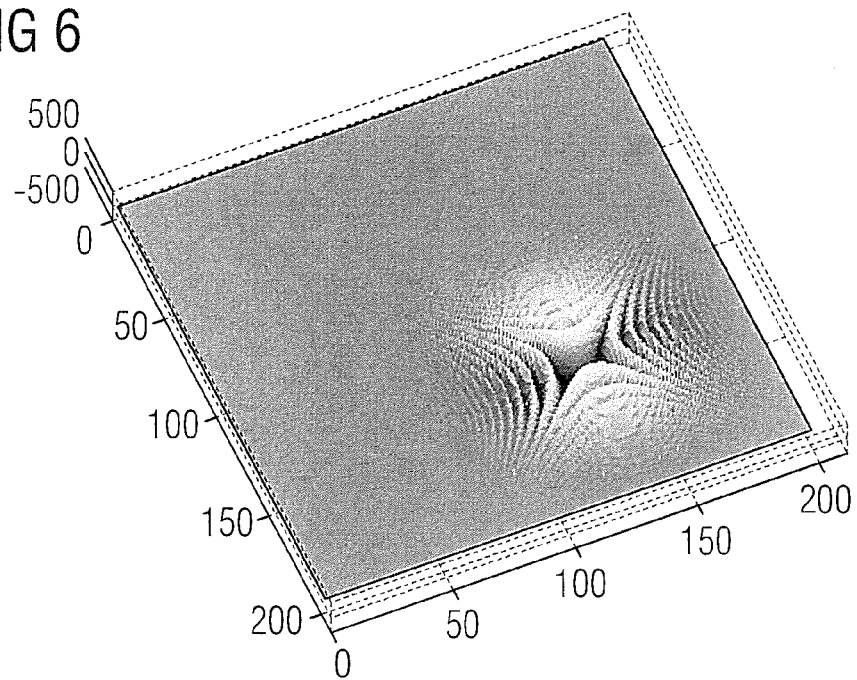
FIG. 6 shows a second example of a point spread function for a nonlinear gradient.

FIG. 6 shows an example of a point spread function for the nonlinear gradients $x^2-y^2$.

Figure 7:
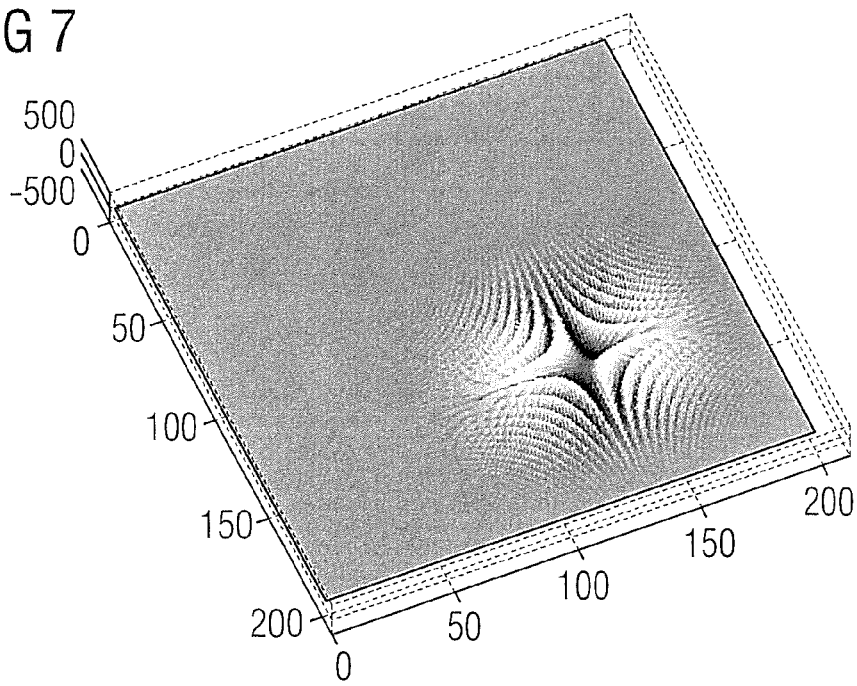
FIG. 7 shows a third example of a point spread function for a nonlinear gradient.

FIG. 7 shows an example of a point spread function for the nonlinear gradients $x*y$.

Figure 8:
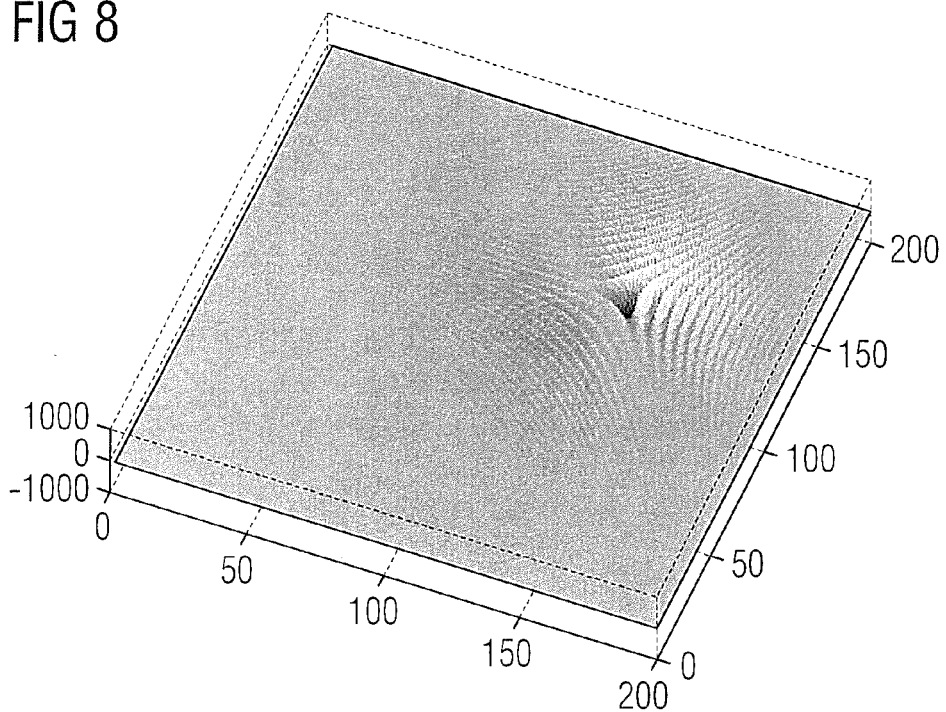
FIG. 8 shows a fourth example of a point spread function for a nonlinear gradient.

FIG. 8 shows an example of a point spread function for the nonlinear gradients $x*(x^2-3*y^2)$.

Figure 9:
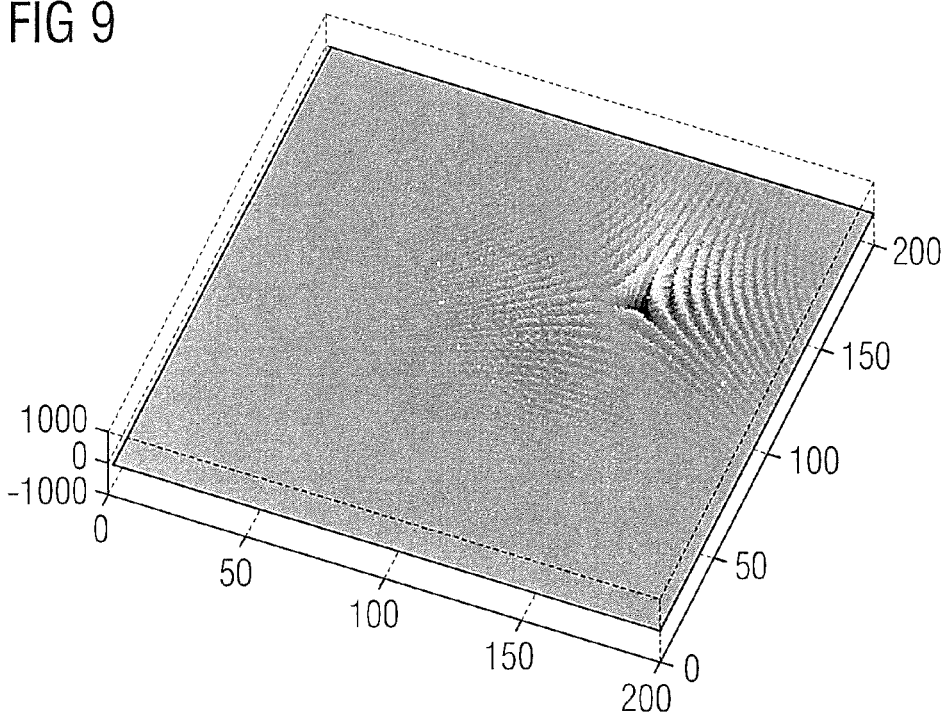
FIG. 9 shows a fifth example of a point spread function for a nonlinear gradient.

FIG. 9 shows an example of a point spread function for the nonlinear gradients $y*(3*x^2-y^2)$.

In summary, the invention concerns a method, a magnetic resonance system, and a computer-readable storage medium for generation, by operation of the magnetic resonance system, of magnetic resonance measurement data of an imaging area of an examination subject located in a measurement volume of a magnetic resonance system. Within the scope of the acquisition of the magnetic resonance measurement data, at least one additional nonlinear gradient is switched in addition to the gradients for spatial coding, and k-space is read out according to a random pattern with a lower density than is required by the Nyquist condition.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate magnetic resonance data of an imaging area of an examination subject, comprising:
    operating a magnetic resonance data acquisition unit, having a measurement volume in which said imaging area of the examination subject is situated, to excite nuclear spins in the imaging area by successively radiating radiofrequency (RF) excitation pulses and thereby causing said nuclear spins to emit echo signals;
    operating the magnetic resonance data acquisition unit to detect said echo signals after each radiated RF excitation pulse, while activating different magnetic field gradients that spatially encode said echo signals and reading out the spatially encoded echo signals;
    operating the magnetic resonance data acquisition unit to enter data representing the read-out spatially encoded echo signals into an electronic memory at respective data entry points in said memory organized as k-space, along trajectories of said data points that are predetermined by said gradients for spatial coding, according to a random pattern of said trajectories with a density of data entry points in k-space occupied by said read-out spatially encoded echo signals that is less than required by the Nyquist criterion, and with at least one additional non-linear magnetic gradient being activated in addition to said gradients for spatial coding; and
    generating a data file representing k-space into which said read-out spatially encoded echo signals have been entered, and making said data file available in electronic form as magnetic resonance measurement data of said imaging area.

2. A method as claimed in claim 1 comprising entering said read-out spatially encoded echo signals into k-space along radial trajectories.

3. A method as claimed in claim 1 comprising operating said magnetic resonance data acquisition unit to vary an amplitude of at least one of said magnetic field gradients for spatial encoding according to a random pattern between radiation of successive RF excitation pulses.

4. A method as claimed in claim 1 comprising employing, as said random pattern, a pattern that causes a region along each trajectory, comprising data points that are occupied by the read-out spatially encoded echo signals, to be varied from trajectory-to-trajectory.

5. A method as claimed in claim 1 wherein said at least one non-linear gradient has an amplitude, and operating said magnetic resonance data acquisition unit to change said amplitude during entry of the spatially encoded echo signals along a trajectory, according to a random pattern, from one of said trajectories to another of said trajectories into which said read-out spatially encoded echo signals are entered following a next-successive RF excitation pulse.

6. A method as claimed in claim 5 comprising changing the amplitude of said at least one non-linear gradient according to said random pattern during read-out along one of said trajectories.

7. A method as claimed in claim 1 comprising changing a non-linear term of said at least one non-linear gradient according to a random pattern during read out along one of said trajectories.

8. A magnetic resonance apparatus comprising:
    a magnetic resonance data acquisition unit adapted to receive an examination subject therein, said examination subject comprising an imaging area situated in a measurement volume of the data acquisition unit, said data acquisition unit comprising a radio-frequency (RF) antenna arrangement;
    a control unit configured to operate the data acquisition unit to excite nuclear spins in said imaging area by radiating successive RF excitation pulses from said RF antenna arrangement, the excited nuclear spins producing echo signals;
    said control unit being configured to detect said echo signals with said RF antenna arrangement after each radiated RF excitation pulse while operating said gradient system to activate different gradient magnetic fields that spatially encode said echo signals;
    an electronic memory comprising a plurality of data entry points organized as k-space;
    said control unit being configured to enter the spatially encoded echo signals at respective data points in k-space along trajectories of said data entry points in k-space that are predetermined by said gradient magnetic fields, to enter said echo signals into k-space according to a random pattern of said trajectories, with less density of data entry points in k-space occupied by the spatially encoded echo signals than is required by the Nyquist criterion, and activating at least one additional non-linear magnetic field gradient, in addition to the magnetic field gradients activated for spatial coding; and said control unit being configured to make k-space, into which said echo signals have been entered, available in electronic form as a data file representing magnetic resonance measurement data of said imaging area.

9. A non-transitory, computer-readable data storage medium encoded with programming instructions, said data storage medium being loaded into a computerized control unit of a magnetic resonance apparatus, said magnetic resonance apparatus also comprising a data acquisition unit and said control unit comprising an electronic memory comprising data entry points organized as k-space, said programming instructions causing said computerized control unit to:

operate the data acquisition unit to excite nuclear spins in an imaging area of an examination subject situated in a measurement volume of the data acquisition unit, by radiating successive radio frequency (RF) excitation pulses, the excited nuclear spins producing echo signals;

operate the data acquisition unit to detect said echo signals after each radiated RF excitation pulse, while activating different magnetic field gradients that spatially encode said echo signals, and to enter the spatially encoded echo signals into k-space along trajectories of said data entry points that are predetermined by the activated magnetic field gradients for spatial coding, with said echo signals being entered into k-space according to a random pattern of said trajectories with less density of data entry points occupied by the spatially encoded echo signals than required by the Nyquist criterion, and to activate at least one additional non-linear magnetic field gradient in addition to the magnetic field gradients activated for spatial coding; and make k-space into which said spatially encoded echo signals have been entered, available at an output of the control unit in electronic form as a data file representing magnetic resonance measurement date of said imaging area.

* * * * *